US006657495B2

(12) United States Patent
Ivanov et al.

(10) Patent No.: US 6,657,495 B2
(45) Date of Patent: Dec. 2, 2003

(54) OPERATIONAL AMPLIFIER OUTPUT STAGE AND METHOD

(75) Inventors: Vadim V. Ivanov, Tucson, AZ (US); Wally Meinel, Tucson, AZ (US); David Baum, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/113,272

(22) Filed: Apr. 1, 2002

(65) Prior Publication Data
US 2003/0184379 A1 Oct. 2, 2003

(51) Int. Cl.[7] ................................. H03F 3/45
(52) U.S. Cl. ................. 330/255; 330/264; 330/267
(58) Field of Search .................... 330/253, 255, 330/264, 267; 327/359

(56) References Cited

U.S. PATENT DOCUMENTS

| 4,333,058 A |   | 6/1982  | Hoover              |
|-------------|---|---------|---------------------|
| 4,357,578 A |   | 11/1982 | Yokoyama            |
| 4,377,789 A |   | 3/1983  | Hoover              |
| 4,395,675 A |   | 7/1983  | Toumani             |
| 4,532,479 A |   | 7/1985  | Blauschild          |
| 4,555,673 A |   | 11/1985 | Huijsing            |
| 4,578,630 A |   | 3/1986  | Grosch              |
| 4,656,435 A | * | 4/1987  | Czarniak et al. ......... 330/253 |
| 5,311,145 A | * | 5/1994  | Huijsing et al. ......... 330/255 |
| 5,371,419 A |   | 12/1994 | Sundby              |
| 5,436,818 A |   | 7/1995  | Barthold            |
| 5,500,624 A |   | 3/1996  | Anderson            |
| 5,528,125 A |   | 6/1996  | Marshall            |
| 5,550,510 A |   | 8/1996  | Nagaraj             |
| 5,602,463 A |   | 2/1997  | Bendall             |
| 5,777,514 A |   | 7/1998  | Mittal              |
| 5,808,513 A |   | 9/1998  | Archer              |
| 5,880,627 A | * | 3/1999  | Thiel, V .............. 327/562 |
| 6,073,167 A |   | 6/2000  | Poulton et al.      |
| 6,134,167 A |   | 10/2000 | Atkinson            |
| 6,150,883 A |   | 11/2000 | Ivanov              |
| 6,199,128 B1|   | 3/2001  | Sarat               |

OTHER PUBLICATIONS

Torsten Lehmann and Marco Cassia, Ultra–Low Voltage CMOS Cascode amplifier, Department of Information Technology, 4 pages.

* cited by examiner

Primary Examiner—Henry Choe
(74) Attorney, Agent, or Firm—W. Daniel Swayze, Jr.; W. James Brady; Frederick J. Telecky, Jr.

(57) ABSTRACT

A multi-stage differential amplifier with rail-to-rail input may utilize an output stage including first and second low-voltage rated transistors and first and second high-voltage transistors. The first low-voltage rated transistor and the first high-voltage rated transistor may be connected in series, and the second low-voltage rated transistor and the second high-voltage rated transistor may be connected in parallel. The low-voltage rated transistors are biased by signals provided by the input stage. In this way, the input stage controls the biasing of the low-voltage rated transistors in the output stage, thereby increasing the overall gain and speed of the amplifier system.

28 Claims, 3 Drawing Sheets

OPERATIONAL AMPLIFIER OUTPUT STAGE AND METHOD

FIELD OF THE INVENTION

The present invention relates to operational amplifiers.

BACKGROUND OF THE INVENTION

In many areas of the electronics industry, electronic circuit designers are turning toward lower operating voltages. This enables electronic circuit designers to design systems with smaller power supplies. Smaller power supplies increase the life expectancy of the system power supply and reduce product weight and size. This is especially true where dc power supplies are used to sustain circuit operation.

However, while reduced operating voltages are beneficial in reducing product size and extending useful battery life, the lower voltages typically adversely affect circuit operation. For example, as circuit supply voltages are reduced, the range of circuit signal voltages which are available for circuit operation is also reduced.

One method of increasing the voltage range over which an amplifier operates, involves using a two-stage differential amplifier. A two-stage differential amplifier has both a differential input stage and a differential output stage. In a typical two-stage differential amplifier arrangement, the input stage of the differential amplifier may use complementary pairs of input transistors and may operate rail-to-rail.

Prior art FIG. 1 depicts an exemplary embodiment of a two-stage differential amplifier 100 which is disclosed in U.S. Pat. No. 6,150,883 issued Nov. 21, 2000 to Ivanov. The Ivanov patent generally discloses a differential amplifier 100 with a rail-to-rail common mode input stage. The amplifier 100 includes a first supply rail (V+), a second supply rail (V−), first ($V_{IN+}$) and second ($V_{IN-}$) input terminals for receiving a differential input signal, a current bias circuit 49 for summing the voltage provided by the input stage, and an output stage. The amplifier may include a first pair of the complementary input transistors connected to a high-voltage input $V_{1+}$ and a second pair of complementary transistors connected to a low-voltage input $V_{1-}$. The high-voltage input $V_{1+}$ is the sum of the common mode voltage $V_{CM}$ of the input signal and the difference between high rail and low rail voltages $\Delta V$ (e.g., $V_{1-}=V_{CM}+\Delta V$). Similarly, the voltage $V_{1-}$ is the difference of the common mode voltage $V_{CM}$ of the input signal and the difference between high rail and low rail voltages $\Delta V$ (e.g., $V_{1-}=V_{CM}-\Delta V$). Thus, when taken together, the differential part of the input signal is two times the difference of the rail voltages or $2\Delta V$ allowing amplifier 100 to operate at low rail-to-rail supply voltages.

While the amplifier 100 may provide a circuit which is linearly operable at a low range of rail-to-rail supply voltages, the overall bandwidth of the amplifier may be limited in large part by the size and transconductance of the output transistors. Transconductance g, is a measure of the gain (e.g., bandwidth) of a differential amplifier. Thus, where an output stage is used, such as with a two-stage differential amplifier, the transconductance of the output stage becomes a limiting factor, affecting both the overall gain of the amplifier, and the speed at which the amplifier may operate.

For example, the overall open loop gain of the two-stage differential amplifier 100 may be approximated by the following equation, $$A = g_1 Z_{eqv} g_{out} Z_L \quad (1),$$

where A is the overall gain of the amplifier, $g_1$ is the transconductance of the input stage, $Z_{eqv}$ is the equivalent impedance in the node comprising the gates of the output transistors, $g_{out}$ is the transconductance of the output transistors and $Z_L$ is the overall load impedance. Consequently, where the transconductance $g_1$ of the input stage and the load impedance $Z_L$ are held constant, the overall gain of the amplifier A may be dominated by both the transconductance of the output transistors $g_{out}$ and the equivalent impedance in the node comprising the gates of the output transistors $Z_{eqv}$. In this instance $Z_{eqv}$ may be calculated based on the size and/or dimensions of the output transistors used.

The size of each of the transistors corresponds the maximum load current of the system and the acceptable saturation voltage for a given load at a maximum given gate drive. The gate drive of the output stage is limited by the supply voltage and the amplifier control circuitry. Further, the drain/source characteristic of the output stage should be designed to withstand the maximum supply voltage of the overall circuit.

Where a high-voltage CMOS transistor is used, such as with amplifier 100, the high-voltage transistor typically has a longer channel and often thicker gate oxide than with a comparable low-voltage transistor. In some cases the overall size of the channel of the high-voltage transistor, as given by the longer channel and thicker gate oxide, is often 5–20 times that of a similar low-voltage transistor. Consequently, when comparing the operational speed of the high-voltage rated transistor to that of the low-voltage rated transistor, a signal may take up to 5–20 times longer to propagate across the high-voltage transistor channel.

SUMMARY OF THE INVENTION

A circuit according to various aspects of the present invention includes an output stage utilizing both low-voltage rated transistors and high-voltage rated transistors. Thus, the circuit provides a differential amplifier with a higher gain to speed ratio over the prior art.

More particularly, the low-voltage transistors may be controlled (e.g. biased) from the input stage. The input stage may be of any appropriate configuration, such as, for example, rail-to-rail or single-supply configuration. The differential amplifier may further employ an output stage including a pair of low-voltage rated transistors and a pair of high-voltage rated transistors. Control circuitry may further be used to regulate the current provided to the high-voltage rated transistors and the low-voltage transistors of the output stage, such that the gain-speed-power figure of merit for the circuit is increased.

In one exemplary embodiment of the present invention, a cascode circuit may be used to control the current provided by the differential amplifier input stage. The differential amplifier output stage may include a current steering circuit for biasing the gates of the low-voltage transistors, and for providing, that both the low-voltage transistors and the high-voltage transistors remain above their respective transistor saturation points during operation. The cascode circuit may be connected to the current steering circuit which may be further connected to the low-voltage transistors. The low-voltage transistors may be further connected to the high-voltage transistors and to the output conductor of the amplifier circuit.

The transconductance of the output stage of the differential amplifier may be increased over amplifiers using only high-voltage transistors, thereby improving the overall speed of the differential amplifier system. The overall speed of the differential amplifier systems may be improved in accordance with the length of the channels of the low-voltage transistors used. For example, since the size of the low-voltage transistors controlled by the input stage is 5–20 times smaller as compared to the straight forward use of high-voltage transistors, then the transconductance and thus the overall gain of the differential amplifier may be increased by 5–10 times over differential amplifiers using a traditional output stage configuration.

BRIEF DESCRIPTION OF DRAWINGS

A more complete understanding of the present invention may be derived by referring to the various exemplary embodiments which are described in conjunction with the appended drawing figures in which like numerals denote like elements, and in which.

DETAILED DESCRIPTION OF VARIOUS EXEMPLARY EMBODIMENTS

Figure 1:
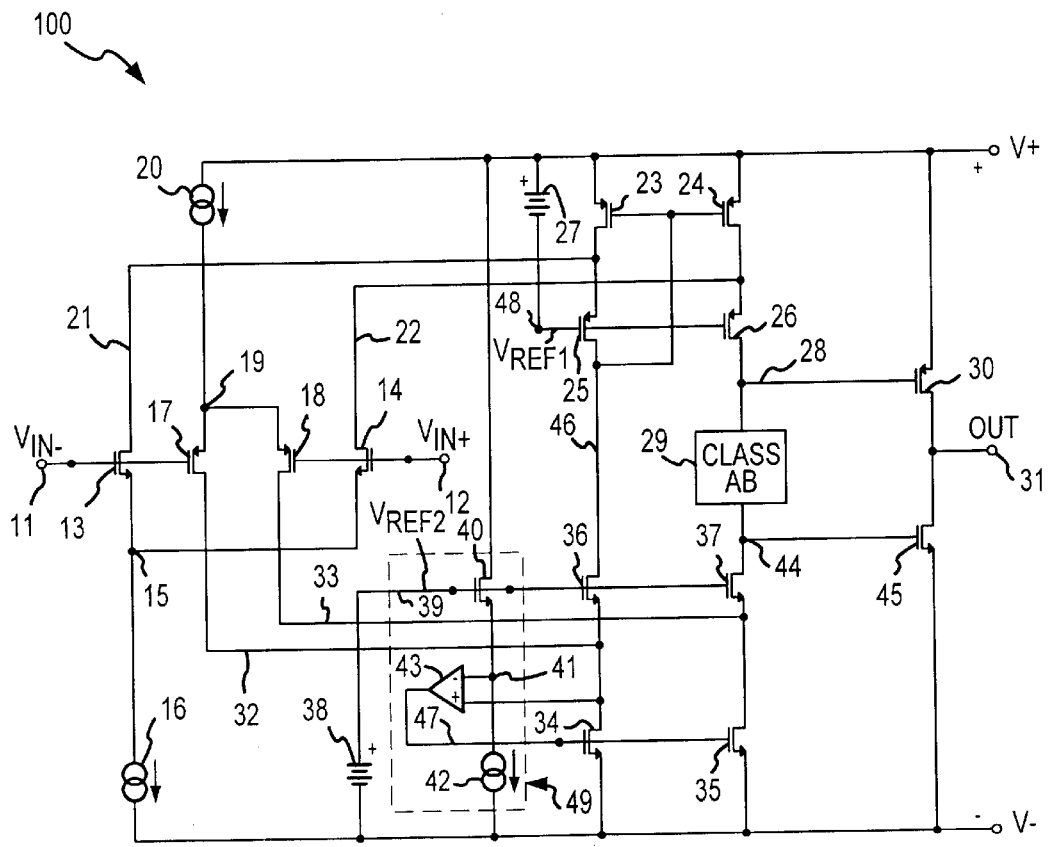
FIG. 1 is a schematic representation of a prior art embodiment of a two-stage differential amplifier including an input stage, an output stage, and a current steering circuit.

The various exemplary embodiments may be described in terms of various functional components and various processing steps and stages. Such functional components may be realized by any number of hardware or structural components configured to perform the specified functions. For example, the various exemplary embodiments may employ integrated components comprised of various electrical devices, e.g., resistors, transistors, capacitors, diodes and the like, whose values may be suitably configured for various intended purposes. In addition, the various exemplary embodiments may be practiced in any circuit application in which operational amplifiers are utilized. For purposes of illustration only, the various exemplary embodiments are described herein in connection with operational amplifiers containing a differential input stage.

Further, the particular implementations shown and described are illustrative examples of the various embodiments and are not intended to otherwise limit the scope of the disclosure in any way. Indeed, for the sake of brevity, conventional electronics, transistors, differential amplifiers and other functional aspects of the various embodiments (and components of the individual operating components of the various embodiments) may not be described in detail. Furthermore, the connecting lines shown in the various figures are intended to represent functional relationships and/or physical or logical couplings between the various elements. Many alternative or additional functional relationships, physical connections or logical connections may be present in a practical differential amplifier construction, and as such, are within the scope of the various exemplary embodiments. Further still, while various components may be suitably coupled or connected to other components within the exemplary circuits, such connections and couplings can be realized by direct connection between components, or by connection through other components and devices.

As noted, prior art two-stage differential amplifiers typically use high-voltage rated transistors in the amplifier output stage. Use of the high-voltage transistors detrimentally affects the overall gain of the amplifier due to the high-voltage transistor's low transconductance. In accordance with equation (1) above, when all other factors are held constant, the larger the transconductance figure for a device, the greater the gain (e.g, amplification) it is capable of delivering. Therefore, it is desirable to use a transistor with a higher transconductance figure to increase the overall gain of the amplifier. Further, since the transconductance $g_x$ for a particular transistor may be approximated by, $$g_x = \mu \frac{W}{L} Q_{IS(D)} \quad (2)$$

where $\mu$ is the carrier mobility, W is the channel width, L is the channel length, and $Q_{IS(D)}$ is the inversion charge density evaluated at the transistor source (drain) end, it can be seen that the transconductance of the low-voltage rated transistor with the smaller channel length, is higher than the transconductance of the higher voltage rated transistor with the longer channel length. Consequently, a differential amplifier designed with low-voltage rated transistors in the output stage may considerably increase the overall gain of the differential amplifier circuit.

Further still, since channel length and width are smaller in low-voltage rated transistors, the time it takes for a signal to propagate across a high-voltage transistor channel is shorter than it would take the same signal to propagate across a high-voltage transistor channel. Consequently, using low-voltage transistors not only increases the amplifier gain, but also the amplifier speed.

Figure 2:
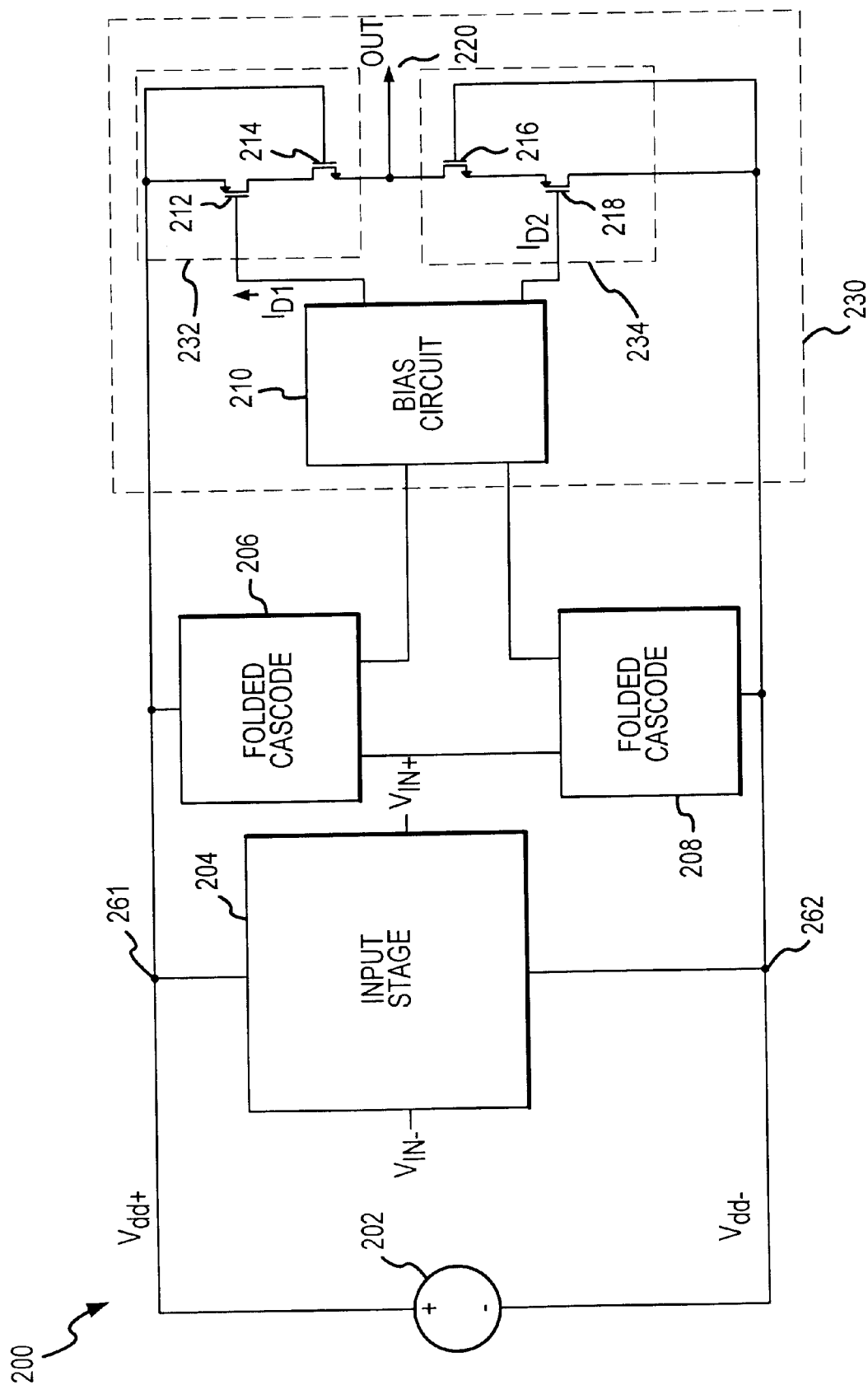
FIG. 2 is an exemplary block representation of a two-stage differential amplifier in accordance with various aspects of the present invention, where the differential amplifier includes a rail-to-rail input stage, a current steering circuit, and an output stage including a pair of high-voltage rated transistors and a pair of low-voltage rated transistors.

FIG. 2 shows a block diagram of a two-stage differential amplifier 200 in amplifier output stage 250 may include low-voltage transistors. Differential amplifier 200 includes a voltage source 202, an input stage 204, folded cascode circuits 206 and 208, and a differential amplifier output stage 230. The amplifier 200 may operate at very low rail-to-rail voltages $V_{dd+}$ (e.g., upper rail voltage) and $V_{dd-}$ (e.g., lower rail voltage) provided by the voltage source stage 202. Amplifier 200 may be implemented with any suitable input stage, such as, for example, a rail-to-rail input stage or a single-supply input stage, or the like. For example, one suitable input stage is described in U.S. Pat. No. 6,150,883 issued to Ivanov and incorporated herein by reference.

The upper rail voltage $V_{dd+}$ provided by voltage source 202 may be connected to the input stage 204 at node 261. Similarly, the lower rail voltage $V_{dd-}$ provided by voltage source 202 may be connected to the input stage 204 at node 262. Input stage 204 may be connected to the differential amplifier output stage via a first folded cascode circuit 208, which may further be connected to a second cascode circuit 206. Folded cascode circuit 206 may be further connected to the upper supply rail $V_{dd+}$ at node 261, and folded cascode circuit 208 may be connected to the lower supply rail $V_{dd-}$ at node 262. Folded cascode circuit 206 and folded cascode circuit 208 may further be connected to a bias circuit 210 (e.g., current steering circuit 210).

Voltage source 202 may be any suitable source for providing rail-to-rail voltages ($V_{dd+}$ and $V_{dd-}$) to an input stage of a two-stage differential amplifier. In particular, the voltages $V_{dd+}$ and $V_{dd-}$ may be used to define the rail-to-rail common mode range of amplifier 200. That is, $V_{dd+}$ and $V_{dd-}$ may define the upper and lower voltage limits of operation of differential amplifier input stage 204.

Input stage 204 may be any suitable differential amplifier input stage. In particular, input stage 204 may be any input stage operable to receive a current signal and provide a differential voltage output. As noted, one suitable input stage is disclosed in the Ivanov patent.

Folded cascode circuits 206 and 208 may be any suitable folded cascode circuit. A suitable folded cascode circuit for use with the present invention is disclosed in U.S. Pat. No. 6,043,708 issued Mar. 28, 2000 to Barr, or the like. The folded cascode circuits 206 and 208 may increase the gain of the input stage 204, and allow the dc level of the signal provided by input stage 204 to be substantially similar to the dc level of the signal provided to the output stage, barring any parasitic capacitances. In addition, the operation of folded cascode circuits 206 and 208 may be characterized by high gain due to the large impedance seen at the folded cascode circuit 206 and 208 output.

Folded cascode circuits 206 and 208 may be connected to the differential amplifier output stage 230. The output stage 230 may provide the amplifier 200 with a low output resistance so that the amplifier 200 may deliver an output signal to a load with minimal loss of gain. In an exemplary embodiment, the output stage 230 of the differential amplifier circuit 200 may comprise a bias circuit 210, upper current control circuit 232 and lower current control circuit 234.

Transistor bias circuit 210 may be any suitable circuit for ensuring that current may flow to at least one of the low-voltage transistors 212 and 218 at any given time. For example, transistor bias circuit 210 may be any suitable class A, B, or AB amplifier circuit, but may preferably be a class AB amplifier. A suitable class AB circuit for use with the present invention may include the class AB circuits described for example in U.S. Pat. No. 5,825,244, U.S. Pat. No. 5,497,122 both issued to Somayajula, or U.S. Pat. No. 5,311,145 issued to Huijsing et al.

The transistor bias circuit 210 may use a power stage that has output current flow for more than half, but less than all, of the input cycle. The output current flow may vary with the demand placed on the amplifier 200 by any attached load (not shown). Further, as the output current varies, the current $I_{D1}$ and $I_{D2}$ provided to any later connected circuitry (e.g. lower current control circuit 234, upper current control circuit 232, etc.) varies as well. In this way, the bias circuit 210 may control the current being provided to the circuitry connected to the differential amplifier.

Lower current control circuit 234 and upper current control circuit 232 may be any suitable circuit for receiving current from bias circuit 210 and providing the current to output conductor 220 where the bias circuit 210 may drive low-voltage rated transistors. For example, lower current control circuitry 234 may include a low-voltage transistor 212 connected head-to-tail with a high-voltage transistor 214 such that low-voltage rate transistor 212 may receive and be driven by current $I_{D1}$. Similarly, lower current control circuitry 234 may include a low-voltage transistor 218 connected head to tail with a high-voltage transistor 216 such that low-voltage rated transistor 218 may receive and be driven by current $I_{D2}$. Transistors 212, 214, 216, and 218 may be of any suitable construction for receiving a controlled input current from a bias circuit 210 and providing a current output at conductor 220 (e.g., output terminal 220).

In one exemplary embodiment, transistors 212, 214, 216, and 218 are of a MOSFET construction. More particularly, transistors 212 and 214 may be p-channel MOSFETs (e.g., PMOS transistors) and transistors 216 and 218 may be n-channel MOSFETS (e.g., NMOS transistors). Further, transistors 212 and 218 may be low-voltage rated transistors (e.g., low-voltage PMOS transistor 212 and low-voltage NMOS transistor 218), and transistors 214 and 216 may be high-voltage rated transistors (e.g., high-voltage PMOS transistor 214 and high-voltage NMOS transistor 216). Low-voltage transistors 212 and 218 and high-voltage transistors 214 and 216 may be any suitable low-voltage and high-voltage transistors of sufficient dimensional configuration for the conducting of maximum load current at maximum safe drive. Further, the transistors may include a drain to source voltage of about half or less than half of the overall maximum saturation voltage of the amplifier 200.

In an exemplary embodiment, bias circuit 210 may include a first and second output for controlling the biasing of the transistors 212 and 218 wherein the first output may be connected to the gate terminal of first low-voltage transistor 212, and the second output may be connected to the gate terminal of second low-voltage transistor 218. The source of low-voltage transistor 212 may be connected to the high-voltage rail $V_{dd+}$ to permit load current to flow from the supply rail to and through transistors 212 and 214, 216 and 218 and to any attached load. The drain of low-voltage transistor 212 may be further connected to the source of high-voltage transistor 214 for providing a current to high-voltage transistor 214. The drain of high-voltage transistor 214 may be connected to the source of high-voltage transistor 216 and to the output conductor 220 for providing output current to conductor 220. The gate of high-voltage transistor 214 may be connected to the high-voltage rail $V_{dd+}$ via a voltage source 213 for biasing the transistor 214 in the active region. Similarly, the gate of high-voltage transistor 216 may be connected to low-voltage rail $V_{dd-}$ via a voltage source 217 for biasing the transistor 216 in the active region. The drain of high-voltage transistor 216 may be connected to the drain of low-voltage transistor 218 for providing current to high-voltage transistor 216. Further, the source of low-voltage transistor 218 may be connected to the low-voltage rail $V_{dd-}$ of the differential amplifier 200. In addition, the gates of high-voltage transistor 216 may be connected to the lower rail $V_{dd-}$ of the differential amplifier 200 for biasing the transistors in the active region.

During operation, a first and second current from the input stage may be provided to the first and second cascode circuits 206 and 208, respectively. The cascode circuits further may provide the current signals to bias circuit 210, which in turn, may provide (e.g., drives) the current signals to the low-voltage transistors 212 and 218. As the current provided from the input stage 204 varies, the current provided to the lower current control circuit 234 and to the upper current control circuit 232, varies as well. Further, the bias circuit 210 may control the current provided to the later connected circuitry in accordance with the varying voltage. More particularly, the first current $I_{D1}$ provided by bias circuit 210 may bias the transistor 212, and the second current $I_{D2}$ provided by bias circuit 210 may bias the transistor 218. The biasing of transistors 212 and 218 may be such that the bias circuit 210 controls the differential mode component of the currents received from input stage 204. When no differential mode component exists, the bias circuit 210 may drive a low quiescent current through transistors 212 and 218.

When a positive current flows from the input stage 204 to bias circuit 210, the bias circuit 210 may provide increased current to transistor 212 while decreasing the current in transistor 218. That is, the bias circuit 210 draws current away from transistor 218 while the current is added to transistor 212. In addition, the amount of current drawn from transistor 218 and provided to transistor 212 is correlative to the amount of current provided to bias circuit 210 by input stage 204. Alternatively, when a negative current flows from the input stage 204 to bias circuit 210, the bias circuit 210 may provide increased current to transistor 218 while decreasing the current to transistor 212. That is, the bias circuit 210 may draw current away from transistor 212 and add the current to transistor 218. The amount of current drawn from transistor 212 and provided to transistor 218 is correlative to the amount of current provided to bias circuit 210. In this way, the bias circuit 210 may ensure that at least one of the output transistors remains conducting during amplifier 200 operation. More particularly, the bias circuit 210 may measure the transistor 212 and transistor 218 current, and may further keep the smaller of the two currents stable by redistributing the current provided by the input stage 204. For example, bias circuit 210 may measure the current of transistor 212 and transistor 218. If the current being measured drops below the threshold for maintaining the transistor in the active region, then current from the folded cascade circuit corresponding to the remaining low-voltage transistor may be diverted to the gate of the transistor experiencing the current drop. In addition, transistor 212 may further provide its transistor current to transistor 214 and transistor 218 may provide its transistor current to transistor 216. Further, the high-voltage transistors 214 and 216 may limit the drain voltages of the low-voltage transistors 212 and 218.

In the above-described configuration, the gain-speed-power factor of the differential amplifier 200 is improved over systems using only high-voltage transistors since the input stage drives low-voltage transistors with a dimensionally smaller gate than high-voltage transistors.

Figure 3:
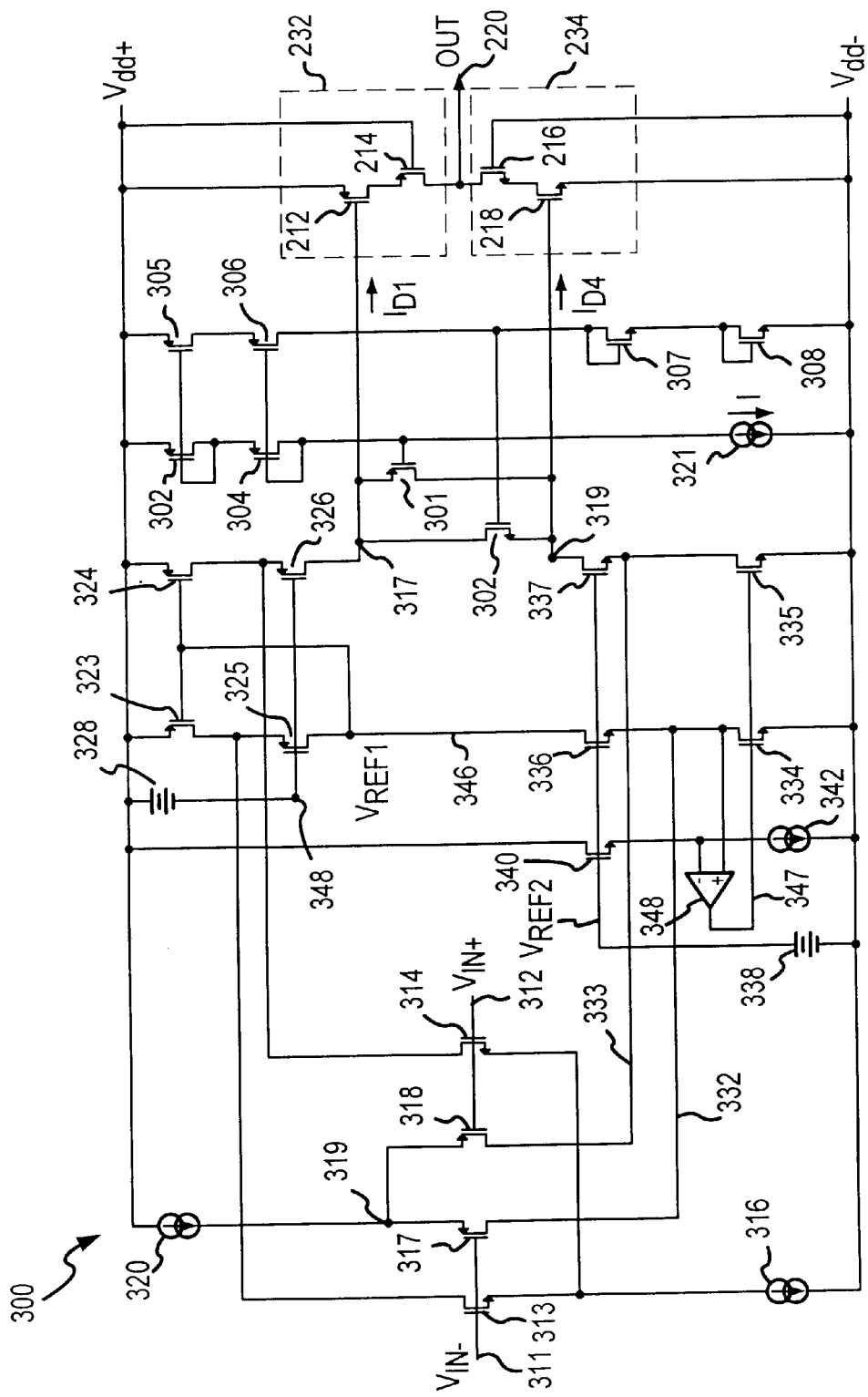
FIG. 3 a schematic circuit representation of another two-stage differential amplifier in accordance with various aspects of the present invention, where the differential amplifier includes a rail-to-rail input stage, and an output stage including a pair of high-voltage rated transistors and a pair of low-voltage rated transistors.

FIG. 3 illustrates another exemplary embodiment of a two-stage differential amplifier 300 in accordance With various aspects of the present invention including an input stage and an output stage described more fully below. Where FIG. 2 and FIG. 3 contain similarly labeled elements, those elements may have similar operation and description. The input stage of the differential amplifier 300 may be any suitable input stage, such as the input circuit disclosed in U.S. Pat. No. 4,555,673, issued to Huijsing et al. Briefly stated, the input stage may include a current steering control circuit (e.g., bias circuit) consisting of current sources 320 and 316, and transistor 314. The control circuit operates over the signal input range to control the current distribution in the input transistors 313, 314, 317, and 318, and therefore controls the current provided to the summing circuit, described more fully below.

The input stage of the differential amplifier 300 may include first 313 and second 314 input transistors of a first conductivity type. Each transistor may include a first electrode coupled to a first terminal of a first current source 320 and a second terminal coupled to the first supply voltage rail $V_{dd+}$. Differential amplifier 300 may further include third 317 and fourth 318 input transistors of a second conductivity type each including a first electrode coupled to a first terminal of a second current source 316 and a second terminal coupled to the second supply voltage rail $V_{dd-}$. The input stage may include a first current summing circuit with first 323 and second 324 current source transistors. Each transistor 323 and 324 may include a first electrode coupled to the first supply voltage rail $V_{dd+}$. The first current source transistor 323 may have a second electrode coupled to a second electrode of the first input transistor 313 and a first electrode of a first cascode transistor 325. The second current source transistor 324 may have a second electrode coupled to a second electrode of the second input transistor 314 and a first electrode of a second cascode transistor 326. A control electrode of each of the first 325 and second 326 cascode transistors may be coupled to a first reference voltage ($V_{REF1}$).

A second current summing circuit includes third 334 and fourth 335 current source transistors. Each transistor 334 and 335 may have a first electrode coupled to the second supply voltage rail $V_{dd-}$. The third current source transistor 334 may have a second electrode coupled to a second electrode of the third input transistor 317 and a first electrode of a third cascode transistor 336. The fourth current source transistor 335 may have a second electrode coupled to a second electrode of the fourth input transistor 318 and a first electrode of a third cascode transistor 337. The third 336 and fourth 337 cascode transistors may each have a control electrode coupled to a second reference voltage ($V_{REF2}$).

The differential amplifier 300 may include a bias circuit connected to terminals 317 and 319. The output stage may further include transistors 301–308, output transistors 212, 214, 216, and 218, and a current source 321 for providing a current $1_{AB}$. Bias circuit may include a complementary pair of control transistors 301 and 302 which may be connected in parallel, i.e., head to tail, to the terminals 317 and 319. The transistors 301 and 302 may supply drive currents in parallel to output transistors 212 and 218 respectively in similar manner as was described with respect to bias circuit 210. Further, an output terminal maybe derived at output conductor 220.

Diode-connected transistors 303 and 304 may be serially connected with current source 321 between upper and lower supply rails $V_{dd+}$ and $V_{dd-}$. Transistors 305 and 306 may be connected with diode connected transistors 307 and 308 between upper and lower supply rails $V_{dd+}$ and $V_{dd-}$. The gate electrodes of transistors 303 and 305 may be connected together as may the gate electrodes of transistors 304 and 306. In this configuration, the transistors 303, 304, 305, 306 may form a current mirror network for providing a biasing current to the gates of transistors 301 and 302.

The gate electrode of transistor 301 may be connected to a junction between diode 304 and current source 321. Similarly, the gate electrode of transistor 302 may be connected to a junction between transistor 306 and diode connected transistor 307.

In general, when the common-mode input voltage is below the reference voltage $V_{IN+}$, at the gate of transistor 314, the differential input pair 314 and 313 may be conductive over the voltage supply range extending from the negative supply voltage Vdd– to the point wherein transistors 317 and 318 become conductive. Conversely, when the common mode input is higher than the reference voltage $V_{IN+}$, the transistors 317 and 318 may redirect the current away from input transistors 313 and 314, which may then be non-conductive.

The outputs of the input transistors 313, 314, 317, and 318 may be added together in the differential amplifier summing circuit, given by transistors 323, 324, 325, 326, 334, 335, 336, and 337, for providing the sum current as drive currents $I_{D1}$ and $I_{D2}$ to the class AB circuit at nodes 317 and 319. Further, the output transistors 212 and 218 may be driven in parallel by the drive currents $I_{D1}$, and $I_{D2}$.

The transistors 212, 214, 216, and 218 may be connected as described with respect to similar elements of FIG. 2. A differential amplifier current bias circuit included in amplifier 300 may include a fifth cascode transistor 340 having a control electrode coupled to the second bias voltage source $V_{REF2}$ and a first electrode coupled to a first terminal of a third current source 342 having a second terminal coupled to the second supply voltage rail $V_{dd}$. The bias circuit may further include a bias amplifier 343 having a first (−) input coupled to the first electrode of the fifth cascode transistor 340, a second input (+) coupled to the second terminal of the third current source transistor 342, and an output coupled to control electrodes of the third 34 and fourth 335 current source transistors.

A bias control circuit may drive, in parallel, drive currents $I_{D1}$, and $I_{D2}$ to transistors 212 and 218, respectively. The bias control circuit may include the transistors 301 and 302 which may drive currents $I_{D1}$, and $I_{D2}$ separately or simultaneously. The transistors 301 and 302 are connected such that the common mode component of the drive currents is unattenuated. The transistors 301 and 302 control the differential mode component of the driver currents $I_{D1}$ and $I_{D3}$, such that class AB operation of the output transistors is obtained. With a low quiescent current through the transistors 301 and 302, no differential mode component of the driver currents may exist. In the quiescent condition, output transistor 212 may be biased by the sum of the gate-source voltages of the transistors 303 and 304 minus the gate-source voltage of transistor 301, i.e., $V_{GS212}=V_{GS303}+V_{GS304}-V_{GS301}$. Similarly, output transistor 218 may be biased by the sum of the gate-source voltages of transistors 307 and 308 minus the gate-source voltage of transistor 302, i.e., $V_{GS218}=V_{GS307}+V_{GS308}-V_{GS302}$.

The present invention is described above with reference to various exemplary embodiments. However, it should be understood that changes and modifications may be made to the exemplary embodiments without departing from the scope of the present disclosure. For example, the various components may be implemented in alternate ways, such as, for example, by providing additional or fewer current mirrors, or additional amplifier stages. Further, the differential amplifier disclosed herein can also include additional elements which may be necessary for the operation of the amplifier, or include various different components of like operation as those described herein. For example, a negative and/or a positive supply regulator may be included and suitably configured to limit, filter or otherwise regulate the internal supply rails. In addition, for embodiments including various current mirrors, the devices can be configured to operate at various frequencies and other operating parameters. It should be understood that the configuration of the differential amplifier (e.g., transistors), implemented may be suitably selected depending upon the particular application or in consideration of any number of factors associated with the operation of the system. (e.g., the supply voltage, the output voltage, output current, requirements of the receiving load or process). Moreover, these and other changes or modifications are intended to be included within the scope of the present invention, as expressed in the following claims.

What is claimed is:

1. A multi-stage operational amplifier comprising:
   an input stage for providing a differential voltage signal; and
   an output stage for receiving said differential voltage signal, said output stage comprising:
      an upper current control circuit; and
      a lower current control circuit,
      wherein said upper current control circuit comprises a first low voltage transistor for receiving said differential voltage signal, said first low voltage transistor providing a first low voltage transistor current,
      wherein said lower current control circuit comprises a second low voltage transistor for receiving said differential voltage signal, said second low voltage transistor providing a second low voltage transistor current,
      wherein said upper current control circuit comprises a first high voltage transistor for receiving said first low voltage transistor current and providing a first amplifier output, and
      wherein said lower current control circuit comprises a second high voltage transistor for receiving said second low voltage transistor current and providing a second amplifier output.

2. An amplifier according to claim 1, wherein said differential voltage signal is provided to at least one of said first low voltage transistor and said second low voltage transistor in response to the voltage of at least one of said first low voltage transistor and said second low voltage transistor.

3. An amplifier according to claim 2, wherein said first low-voltage transistor is a p-channel mosfet, and said first high-voltage transistor is a p-channel mosfet.

4. An amplifier according to claim 3, wherein said second low-voltage transistor is a n-channel mosfet, and said second high-voltage transistor is a n-channel mosfet.

5. An amplifier according to claim 4, wherein said differential voltage signal is provided to at least one of said first low-voltage amplifier gate and said second low-voltage amplifier gate for biasing said first low-voltage amplifier gate and said second low-voltage amplifier gate.

6. An amplifier according to claim 5 wherein said first low-voltage transistor is characterized by a first low-voltage transistor drain voltage, and said second low-voltage transistor is characterized by a second low-voltage transistor drain voltage.

7. An amplifier according to claim 6, wherein said first high-voltage transistor limits said first low-voltage transistor drain voltage, and said second high-voltage transistor limits said second low-voltage transistor drain voltage.

8. An amplifier according to claim 7, wherein said first low-voltage transistor drain is connected to said first high-voltage transistor source, said first high-voltage transistor drain is connected to said second high-voltage transistor source, said second high-voltage transistor drain is connected to said second low-voltage transistor drain.

9. An amplifier according to claim 8 further comprising a voltage source, said voltage source characterized by at least a positive terminal for supplying an upper rail voltage, and a negative terminal for supplying a lower rail voltage.

10. An amplifier according to claim 9, wherein said first high-voltage transistor gate Is connected to said upper rail.

11. An amplifier according to claim 10, wherein said second high-voltage transistor gate is connected to said lower rail.

12. An amplifier according to claim 11, further including a bias circuit, said bias circuit for receiving said differential voltage signal, said bias circuit for biasing at least one of said first low-voltage transistor and said second low voltage transistor in response to the voltage of at least one of said first low-voltage transistor and second low voltage transistor.

13. An amplifier according to claim 12, further including a first folded cascode circuit and a second folded cascode circuit, said first folded cascode circuit configured to receive said differential voltage signal, said first folded cascode circuit further configured to provide said differential voltage signal to said bias circuit, said second folded cascode circuit configured to receive said differential voltage signal, said second folded cascode circuit further configured to provide said differential voltage signal to said bias circuit.

14. A multi-stage operational amplifier with differential voltage input for amplifying a voltage difference, the amplifier comprising:

an input stage for providing a differential voltage signal;

a bias circuit for receiving said differential voltage signal, said bias circuit further providing a first biasing signal and a second biasing signal;

an output stage for receiving said first and second biasing signal, said output stage comprising:

a first low-voltage transistor for receiving said first biasing signal in response to the first low-voltage transistor voltage level, said first low-voltage transistor providing a first low-voltage transistor current;

a second low-voltage transistor for receiving said second biasing signal in response to the second low-voltage transistor voltage level, said second low-voltage transistor providing a second low-voltage transistor current;

a first high-voltage transistor for receiving first low-voltage transistor current, said first high-voltage transistor for providing a first amplifier output; and a second high-voltage transistor for receiving said second high-voltage transistor current, said second high-voltage transistor for providing a second amplifier output.

15. An amplifier according to claim 14, wherein said first low-voltage transistor is a p-channel mosfet, and said first high-voltage transistor is a p-channel mosfet.

16. An amplifier according to claim 15, wherein said second low-voltage transistor is a n-channel mosfet, and said second high-voltage transistor is a n-channel mosfet.

17. An amplifier according to claims 16, wherein said differential voltage signal is provided to at least one of said first low-voltage amplifier gate and said second low-voltage amplifier gate for biasing said first low-voltage amplifier gate and said second low-voltage amplifier gate.

18. An amplifier according to claim 17 wherein said first low-voltage transistor is characterized by a first low-voltage transistor drain voltage, and said second low-voltage transistor is characterized by a second low-voltage transistor drain voltage.

19. An amplifier according to claim 18, wherein said first high-voltage transistor limited said first low-voltage transistor drain voltage, and said second high-voltage transistor limits said second low-voltage transistor drain voltage.

20. An amplifier according to claim 19, wherein said first low-voltage transistor drain is connected to said first high-voltage transistor source, said first high-voltage transistor drain is connected to said second high-voltage transistor source, said second high-voltage transistor drain is connected to said second low-voltage transistor drain.

21. An amplifier according to claim 20, further comprising a voltage source, said voltage source characterized by at least a positive terminal for supplying an upper rail voltage, and a negative terminal for supplying a lower rail voltage.

22. An amplifier according to claim 21, wherein said low rail voltage is ground.

23. An amplifier according to claim 22, wherein said first high-voltage transistor gate is connected to said upper rail.

24. An amplifier according to claim 23, wherein said second high-voltage transistor gate is connected to said lower rail.

25. An amplifier according to claim 24, further including a first folded cascode circuit and a second folded cascode circuit, said first folded cascode circuit configured to receive said differential voltage signal, said first folded cascode circuit further configured to provide said differential voltage signal to said bias circuit, said second folded cascode circuit configured to receive said differential voltage signal, said second folded cascode circuit further configured to provide said differential voltage signal to said bias circuit.

26. A method for providing a multistage operational amplifier with differential voltage input for amplifying a voltage difference between a pair of differential inputs, the method comprising:

measuring a rail-to-rail common mode voltage provided to a differential transistor pair, the differential pair configured to provide a base-to-source voltage responsive to a common mode voltage;

A providing the base-to-source voltage to an output stage circuit; the output stage circuit including a first low-voltage rated transistor coupled to a first high-voltage rated transistor, the output stage further including a second low-voltage rated transistor coupled to a second high-voltage rated transistor;

providing from the first low-voltage rated transistor to the first high-voltage transistor a first gate-to-source voltage, and providing from the second low-voltage rated transistor to the second high-voltage rated transistor a second gate-to-source voltage;

biasing the first and second low-voltage rated transistors in accordance with the measured rail-to-rail common mode voltage; and biasing the first and second low-voltage rated transistors in response to the voltage level of at least one of the first low-voltage rated transistor and the second low-voltage rated transistor.

27. A method according to claim 26 further comprising the step of providing a class AB circuit for controlling the biasing of the first and second low-voltage rated transistors in accordance with the measured rail-to-rail common mode voltage.

28. A method according to claim 27 further comprising the step of providing a folded cascode circuit for increasing the gain of the multi-stage operational amplifier, the folded cascode circuit configured to receive the base to source voltage and provide a base to source voltage with increased gain to at least one of the first and second low-voltage rated transistors.

* * * * *